(12) United States Patent
Li et al.

(10) Patent No.: US 12,501,620 B2
(45) Date of Patent: Dec. 16, 2025

(54) MEMORY CELL OF CHARGE-TRAPPING NON-VOLATILE MEMORY

(71) Applicant: eMemory Technology Inc., Hsin-Chu (TW)

(72) Inventors: Chun-Hsiao Li, Hsinchu County (TW); Tsung-Mu Lai, Hsinchu County (TW); Cheng-Yen Shen, Hsinchu County (TW); Chia-Jung Hsu, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 411 days.

(21) Appl. No.: 18/151,677

(22) Filed: Jan. 9, 2023

(65) Prior Publication Data

US 2023/0240075 A1   Jul. 27, 2023

Related U.S. Application Data

(60) Provisional application No. 63/303,539, filed on Jan. 27, 2022.

(51) Int. Cl.
*H10B 43/30* (2023.01)
*H10D 30/69* (2025.01)

(52) U.S. Cl.
CPC ............. *H10B 43/30* (2023.02); *H10D 30/69* (2025.01)

(58) Field of Classification Search
CPC ....... H10D 30/69; H10D 64/037; H10B 43/30
See application file for complete search history.

(56) References Cited

U.S. PATENT DOCUMENTS

| | | | |
|---|---|---|---|
| 7,420,256 B2 | 9/2008 | Chae | |
| 8,067,284 B1 | 11/2011 | Levy | |
| 8,343,840 B2 | 1/2013 | Lai | |
| 8,710,578 B2 | 4/2014 | Jenne | |
| 9,349,824 B2 | 5/2016 | Levy | |
| 9,449,985 B1 | 9/2016 | Rabkin et al. | |
| 9,553,175 B2 | 1/2017 | Puchner | |
| 9,899,410 B1 * | 2/2018 | Cho | H10D 30/6892 |
| 10,593,812 B2 | 3/2020 | Ramkumar | |
| 10,699,901 B2 | 6/2020 | Jenne | |

(Continued)

OTHER PUBLICATIONS

Office Action issued by Taiwan Intellectual Property Office on Nov. 7, 2023.

*Primary Examiner* — Vongsavanh Sengdara
(74) *Attorney, Agent, or Firm* — WPAT, PC

(57) ABSTRACT

A memory cell of a charge-trapping non-volatile memory is provided. The memory cell is formed on a well region of a semiconductor substrate. The memory cell includes a storage transistor. A gate structure of the storage transistor includes a first tunneling layer, a second tunneling layer, a trapping layer, a blocking layer and a gate layer. The first tunneling layer is contacted with a surface of the well region. The second tunneling layer covers the first tunneling layer. The trapping layer covers the second tunneling layer. The blocking layer covers the trapping layer. The gate layer covers the blocking layer. The second tunneling layer has gradient nitrogen distribution. A first nitrogen concentration of a first region of the second tunneling layer close to the first tunneling layer is lower than a second nitrogen concentration of a second region of the second tunneling layer close to the trapping layer.

18 Claims, 3 Drawing Sheets

(56) References Cited

U.S. PATENT DOCUMENTS

| | | |
|---|---|---|
| 11,222,965 B2 | 1/2022 | Levy |
| 11,257,912 B2 | 2/2022 | Jenne |
| 2009/0321809 A1* | 12/2009 | Ramaswamy .... H01L 21/02148 |
| | | 257/E29.129 |
| 2010/0270604 A1* | 10/2010 | Lin .................... H10D 30/6891 |
| | | 257/E21.422 |
| 2017/0352732 A1 | 12/2017 | Levy et al. |
| 2018/0351003 A1 | 12/2018 | Jenne et al. |

\* cited by examiner

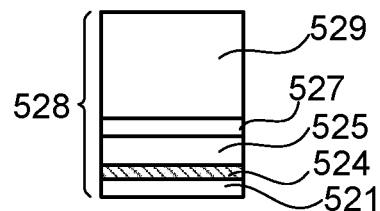
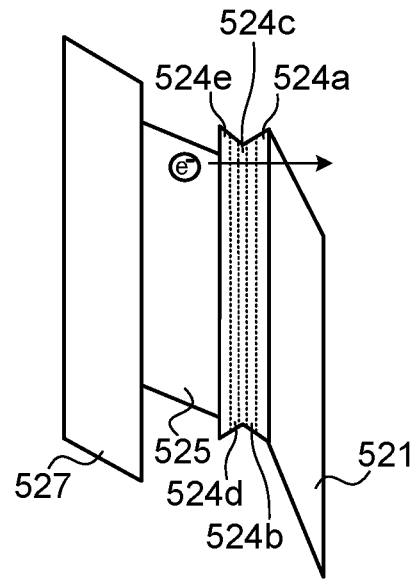
FIG. 6A
FIG. 6B
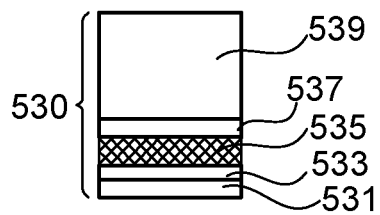
FIG. 7A
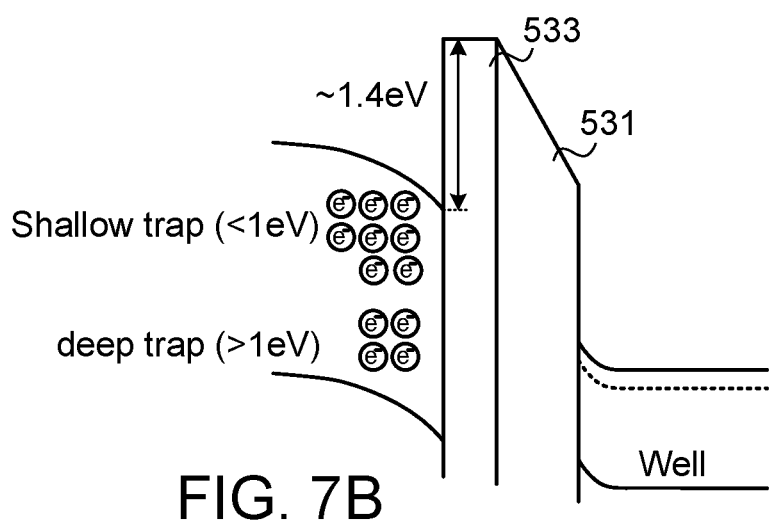
FIG. 7B

MEMORY CELL OF CHARGE-TRAPPING NON-VOLATILE MEMORY

This application claims the benefit of U.S. provisional application Ser. No. 63/303,539, filed Jan. 27, 2022, the subject matter of which is incorporated herein by references.

FIELD OF THE INVENTION

The present invention relates to a memory cell of a non-volatile memory, and more particularly to a memory cell of a charge-trapping non-volatile memory and a gate structure of the memory cell.

BACKGROUND OF THE INVENTION

Non-volatile memories have been widely used in a variety of electronic products. After the supplied power is interrupted, the data stored in the non-volatile memory is still retained.

FIG. 1 is a schematic cross-sectional view illustrating a memory cell of a conventional charge-trapping non-volatile memory. As shown in FIG. 1, a P-well region 100 is formed in a semiconductor substrate. Moreover, three doped regions 101, 103 and 105 are formed in the P-well region 100. The three doped regions 101, 103 and 105 are n-type doped regions. A gate structure 110 is formed over the surface of the P-type well region 110 between the doped regions 101 and 103, and another gate structure 120 is formed over the surface of the P-type well region 100 between the doped regions 103 and 105. Moreover, spacers 132 and 134 are respectively formed on the lateral walls of the gate structures 110 and 120. The spacers 132 and 134 are arranged around the gate structures 110 and 120, respectively.

The gate structure 110 comprises a gate dielectric layer 112 and a gate layer 114. The gate dielectric layer 112 is made of silicon dioxide ($SiO_2$). The gate layer 114 is made of polysilicon. The gate structure 120 comprises a tunneling layer 122, a trapping layer 124, a blocking layer 126 and a gate layer 128. The tunneling layer 122 and the blocking layer 126 are made of silicon dioxide. The trapping layer 124 is made of silicon nitride (SiN). The gate layer 128 is made of polysilicon.

Please refer to FIG. 1 again. The P-well region 100, the doped region 101, the doped region 103, the gate structure 110 and the spacer 132 are collaboratively formed as a switch transistor Msw. The P-well region 100, the doped region 103, the doped region 105, the gate structure 120 and the spacer 134 are collaboratively formed as a storage transistor Ms. In other words, the memory cell comprises a switch transistor Msw and a storage transistor Ms. The switch transistor Msw and the storage transistor Ms are n-type transistors. For example, in case that no charges are stored in the trapping layer 124 of the storage transistor Ms, the memory cell is in a first storage state.

FIG. 2A schematically illustrates the bias voltages for performing a program action on the memory cell of the conventional charge-trapping non-volatile memory. FIG. 2B schematically illustrates the bias voltages for performing an erase action on the memory cell of the conventional charge-trapping non-volatile memory.

Please refer to FIG. 2A. When a program action is performed, the gate layer 114 of the switch transistor Msw receives an on voltage $V_{ON}$, the gate layer 128 of the storage transistor Ms receives a control voltage $V_C$, the doped region 101 receives a ground voltage (0V), the doped region 105 receives a program voltage $V_{PP}$, and the P-well region 100 receives the ground voltage (0V). Consequently, the switch transistor Msw is turned on, and a program current $I_P$ is generated in the region between the doped region 105 and the doped region 101. When the program current $I_P$ flows through a channel region of the storage transistor Ms, charges (e.g., electrons) are transmitted from the channel region of the storage transistor Ms to the trapping layer 124 through the tunneling layer 122. Consequently, the storage state of the memory cell is changed from the first storage state to a second storage state. For example, the program voltage $V_{PP}$ is 6V, the on voltage $V_{ON}$ is 3.3V, and the control voltage $V_C$ is 6V.

Please refer to FIG. 2B. When an erase action is performed, the gate layer 114 of the switch transistor Msw receives an off voltage $V_{OFF}$, the gate layer 128 of the storage transistor Ms receives an erase voltage $V_{EE}$, the doped region 101 receives the ground voltage (0V), the doped region 105 receives the ground voltage (0V), and the P-well region 100 receives the ground voltage (0V). Consequently, a Fowler-Nordheim (FN) tunneling effect is generated. Meanwhile, the charges (e.g., electrons) stored in the trapping layer 124 are ejected to the P-well region 100 through the tunneling layer 122. Consequently, the storage state of the memory cell is changed from the second storage state to the first storage state. The erase voltage $V_{EE}$ is lower than the ground voltage (0V). For example, the magnitude of the erase voltage $V_{EE}$ is 20V. That is, the erase voltage $V_{EE}$ is −20V.

FIG. 3 is an energy band diagram of the gate structure in the storage transistor of the conventional memory cell. As mentioned above, the storage transistor Ms is the n-type transistor. After the Fermi level alignment, the work function $\Phi_G$ of the n-type gate layer 128 is about 4.1 eV, and the work function $\Phi_{well}$ of the P-well region 100 is about 4.6 eV. Consequently, in the energy band diagram, the tunneling layer 122 has higher barrier. During the erase action, it is necessary to provide the erase voltage $V_{EE}$ with the higher magnitude. Since the barrier of the tunneling layer 122 is changed (e.g., along the dotted lines), the electrons can be transmitted through the tunneling layer 122. Under this circumstance, the erase action is completed.

SUMMARY OF THE INVENTION

An embodiment of the present invention provides a memory cell of a charge-trapping non-volatile memory. The memory cell is formed on a well region of a semiconductor substrate. The memory cell includes a storage transistor. A gate structure of the storage transistor includes a first tunneling layer, a second tunneling layer, a trapping layer, a blocking layer and a gate layer. The first tunneling layer is contacted with a surface of the well region. The second tunneling layer covers the first tunneling layer. The trapping layer covers the second tunneling layer. The blocking layer covers the trapping layer. The gate layer covers the blocking layer. The second tunneling layer has gradient nitrogen distribution. The second tunneling layer includes a first region and a second region. A first nitrogen concentration of the first region of the second tunneling layer close to the first tunneling layer is lower than a second nitrogen concentration of the second region of the second tunneling layer close to the trapping layer.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 6A is a schematic cross-sectional view illustrating a gate structure of a storage transistor in a memory cell of a charge-trapping non-volatile memory according to a third embodiment of the present invention;

FIG. 6B is an energy band diagram of the gate structure of the storage transistor in the memory cell as shown in FIG. 6A;

FIG. 7A is a schematic cross-sectional view illustrating a gate structure of a storage transistor in a memory cell of a charge-trapping non-volatile memory according to a fourth embodiment of the present invention; and FIG. 7B is an energy band diagram of the gate structure of the storage transistor in the memory cell as shown in FIG. 7A.

DETAILED DESCRIPTION OF PREFERRED EMBODIMENTS

The present invention provides a memory cell of a charge-trapping non-volatile memory. In the memory cell, the storage transistor has a novel gate structure. When the erase action is performed, an erase voltage with a lower magnitude is provided. Consequently, electrons can be transmitted through the tunneling layer 122, and the erase action can be completed.

Figure 1:
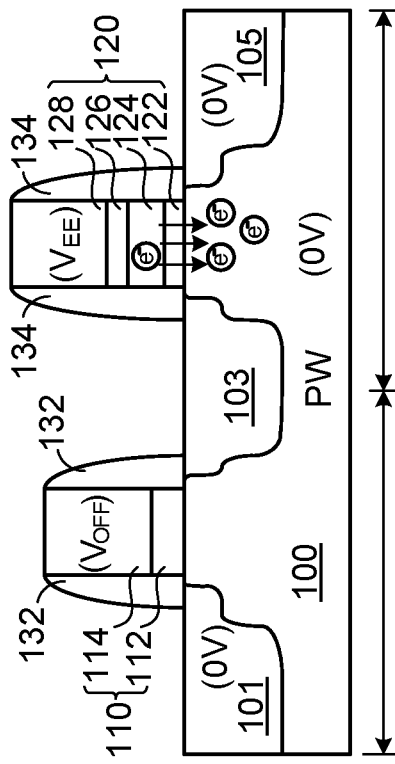
FIG. 1 (prior art) is a schematic cross-sectional view illustrating a memory cell of a conventional charge-trapping non-volatile memory.
Figure 2A:
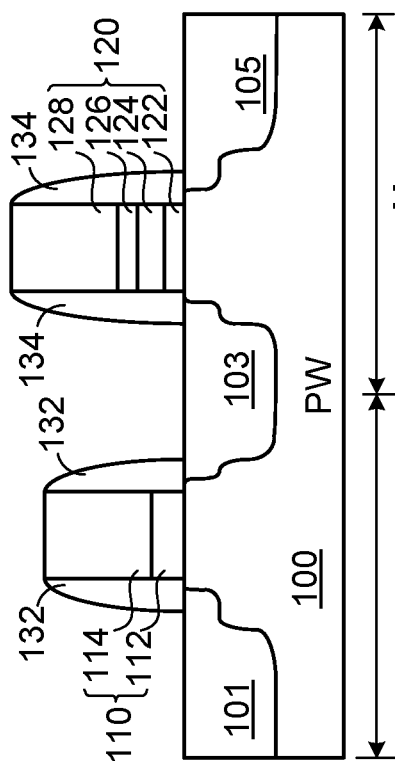
FIG. 2A (prior art) schematically illustrates the bias voltages for performing a program action on the memory cell of the conventional charge-trapping non-volatile memory.
Figure 2B:
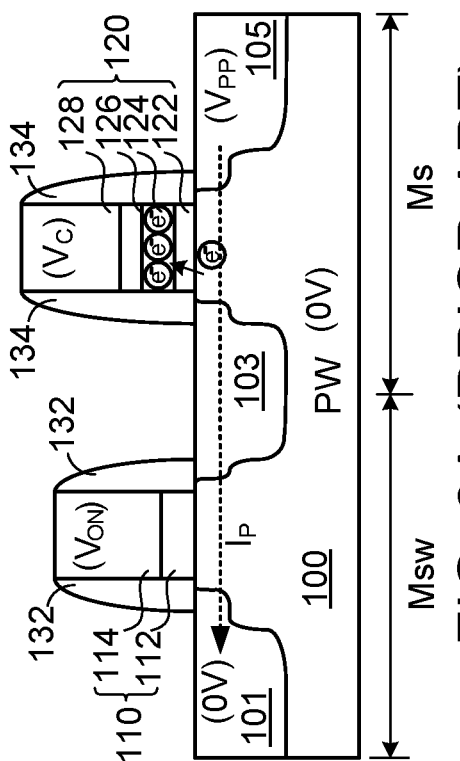
FIG. 2B (prior art) schematically illustrates the bias voltages for performing an erase action on the memory cell of the conventional charge-trapping non-volatile memory.
Figure 3:
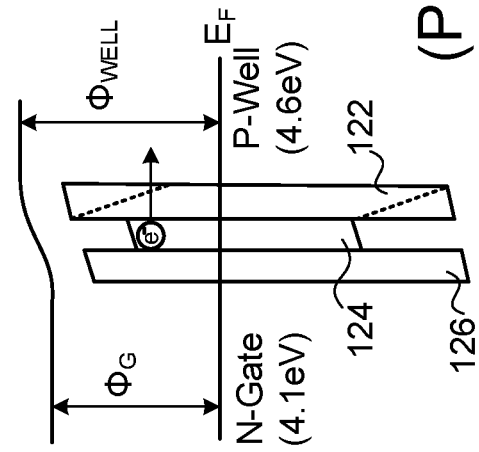
FIG. 3 (prior art) is an energy band diagram of the gate structure in the storage transistor of the conventional memory cell.
Figure 4A:
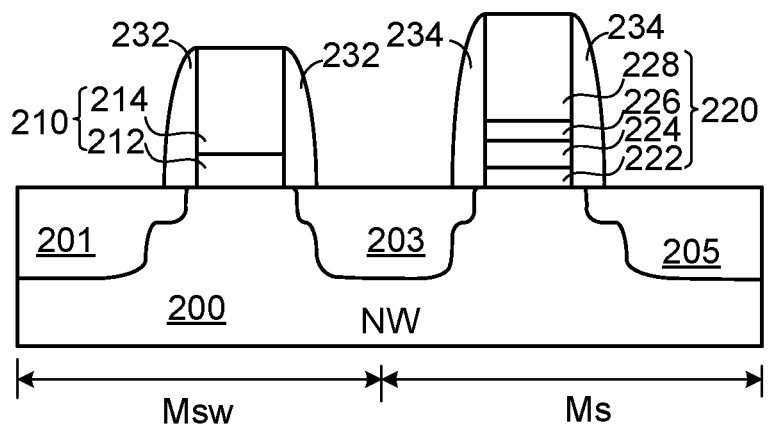
FIG. 4A is a schematic cross-sectional view illustrating a memory cell of a charge-trapping non-volatile memory according to a first embodiment of the present invention.
Figure 4B:
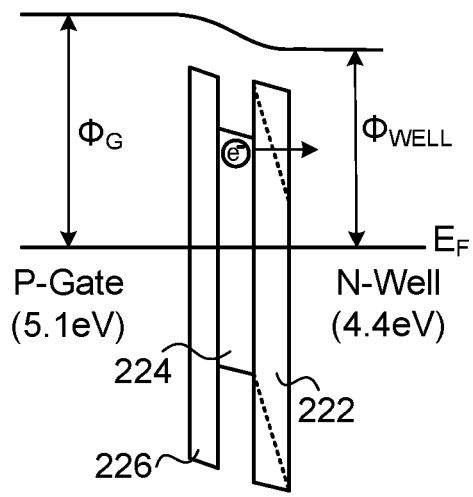
FIG. 4B is an energy band diagram of the gate structure of the storage transistor in the memory cell as shown in FIG. 4A.

FIG. 4A is a schematic cross-sectional view illustrating a memory cell of a charge-trapping non-volatile memory according to a first embodiment of the present invention. FIG. 4B is an energy band diagram of the gate structure of the storage transistor in the memory cell as shown in FIG. 4A.

As shown in FIG. 4A, an N-well region 200 is formed in a semiconductor substrate. Moreover, three doped regions 201, 203 and 205 are formed in the N-well region 200. The three doped regions 201, 203 and 205 are p-type doped regions. A gate structure 210 is formed over the surface of the N-well region 200 between the doped regions 201 and 203, and another gate structure 220 is formed over the surface of the N-well region 200 between the doped regions 203 and 205. Moreover, spacers 232 and 234 are respectively formed on the lateral walls of the gate structures 210 and 220. The spacers 232 and 234 are arranged around the gate structures 210 and 220, respectively.

The gate structure 210 comprises a gate dielectric layer 212 and a gate layer 214. The gate dielectric layer 212 is contacted with the surface of the N-well region 200. The gate layer 214 is formed over the gate dielectric layer 212 to cover the gate dielectric layer 212. The gate oxide layer 212 is made of silicon dioxide ($SiO_2$). The gate layer 214 is made of polysilicon.

The gate structure 220 comprises a tunneling layer 222, a trapping layer 224, a blocking layer 226 and a gate layer 228. The tunneling layer 222 is contacted with the surface of the N-well region 200. The trapping layer 224 is formed over the tunneling layer 222 to cover the tunneling layer 222. The blocking layer 226 is formed over the trapping layer 224 to cover the trapping layer 224. The gate layer 228 is formed over the blocking layer 226 to cover the blocking layer 226. The tunneling layer 222 and the blocking layer 226 are made of silicon dioxide. The trapping layer 224 is made of silicon nitride (SiN). The gate layer 228 is made of polysilicon. The thickness of the tunneling layer 222 is in the range between 30 and 40 angstroms (Å). The thickness of the trapping layer 224 is about 45 angstroms. The thickness of the blocking layer 226 is in the range between 45 and 50 angstroms.

Please refer to FIG. 4A again. The N-well region 200, the doped region 201, the doped region 203, the gate structure 210 and the spacer 232 are collaboratively formed as a switch transistor Msw. The N-well region 200, the doped region 203, the doped region 205, the gate structure 220 and the spacer 234 are collaboratively formed as a storage transistor Ms. In other words, the memory cell comprises a switch transistor Msw and a storage transistor Ms. The switch transistor Msw and the storage transistor Ms are p-type transistors. For example, in case that no charges are stored in the trapping layer 224 of the storage transistor Ms, the memory cell is in a first storage state.

By providing proper bias voltages to the memory cell, a program action or an erase action can be selectively performed on the memory cell.

When the program action is performed, charges (e.g., electrons) are transmitted from a channel region of the storage transistor Ms to the trapping layer 224 through the tunneling layer 222. Consequently, the storage state of the memory cell is changed from a first storage state to a second storage state.

When the erase action is performed, the gate layer 228 of the storage transistor Ms receives an erase voltage $V_{EE}$, and the N-well region 200 receives a ground voltage (0V). That is, the voltage difference between the gate layer 228 of the storage transistor Ms and the N-well region 200 is equal to the erase voltage $V_{EE}$. Meanwhile, the charges (e.g., electrons) stored in the trapping layer 224 are ejected to the N-well region 200 through the tunneling layer 222. Consequently, the storage state of the memory cell is changed from the second storage state to the first storage state.

Please refer to FIG. 4B. As mentioned above, the storage transistor Ms is the p-type transistor. After the Fermi level alignment, the work function $\Phi_G$ of the p-type gate layer 228 is about 5.1 eV, and the work function $\Phi_{well}$ of the N-well region 200 is about 4.4 eV. Consequently, in the energy band diagram, the tunneling layer 222 has lower barrier. During the erase action, the erase voltage $V_{EE}$ with the lower magnitude is feasible. Since the barrier of the tunneling layer 222 is changed (e.g., along the dotted lines), the electrons can be transmitted through the tunneling layer 222 more easily. Under this circumstance, the erase action is completed. For example, the magnitude of the erase voltage $V_{EE}$ is 12V. That is, the erase voltage $V_{EE}$ is –12V.

As mentioned above, the erase voltage $V_{EE}$ denotes the voltage difference between the gate layer 228 of the storage transistor Ms and the N-well region 200. For example, in case that the voltage of –6V is provided to the gate layer 228 of the storage transistor Ms and the voltage of +6V is provided to the N-well region 200, the voltage difference between the gate layer 228 of the storage transistor Ms and the N-well region 200 is equal to the erase voltage $V_{EE}$. Consequently, the erase action can be completed successfully.

In the first embodiment, the gate layer 228 of the storage transistor Ms is made of a material with a higher work function, and the N-well region 200 is made of a material with a lower work function. That is, the work function $\Phi_G$ of the p-type gate layer 228 is higher than the work function $\Phi_{well}$ of the N-well region 200 ($\Phi_G > \Phi_{well}$). For example, the gate layer 228 of the storage transistor Ms is made of p-type polysilicon (with the work function of 5.1 eV), and the N-well region 200 is made of n-type silicon (with the work function of 4.4 eV). Since the work function of the gate layer 228 of the storage transistor Ms is increased, the FN tunneling effect during the erase action will be enhanced.

Certainly, as long as the work function OG of the gate layer is higher than the work function $\Phi_{well}$ of the well region, the materials of the gate layer and the well region are not restricted. For example, in another embodiment, the gate layer is made of p-type polysilicon, and the well region is the p-type well region. Alternatively, the gate layer is made of a metallic material with a higher work function, and well region is the P-well region PW or the N-well region NW.

As mentioned above, the materials of the gate layer of the storage transistor and the well region may be varied according to the practical requirements. Moreover, the material of the gate structure may be varied. For succinctness, only the gate structure of the storage transistor in the memory cell will be described, and the other structures are omitted.

Figure 5A:
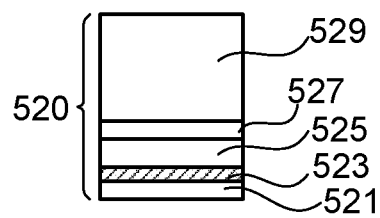
FIG. 5A is a schematic cross-sectional view illustrating a gate structure of a storage transistor in a memory cell of a charge-trapping non-volatile memory according to a second embodiment of the present invention.
Figure 5B:
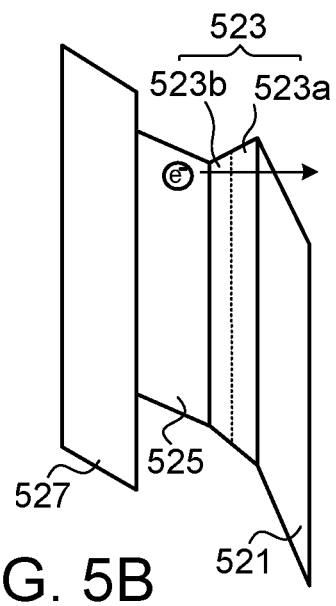
FIG. 5B is an energy band diagram of the gate structure of the storage transistor in the memory cell as shown in FIG. 5A.

FIG. 5A is a schematic cross-sectional view illustrating a gate structure of a storage transistor in a memory cell of a charge-trapping non-volatile memory according to a second embodiment of the present invention. FIG. 5B is an energy band diagram of the gate structure of the storage transistor in the memory cell as shown in FIG. 5A.

As shown in FIG. 5A, the gate structure 520 of the storage transistor Ms comprises a first tunneling layer 521, a second tunneling layer 523, a trapping layer 525, a blocking layer 527 and a gate layer 529. The first tunneling layer 521 is contacted with the surface of the well region. The second tunneling layer 523 is located over the first tunneling layer 521 to cover the first tunneling layer 521. The trapping layer 525 is located over the second tunneling layer 523 to cover the second tunneling layer 523. The blocking layer 527 is located over the trapping layer 525 to cover the trapping layer 525. The gate layer 529 is located over the blocking layer 527 to cover the blocking layer 527. The first tunneling layer 521 and the blocking layer 527 are made of silicon dioxide ($SiO_2$). The second tunneling layer 523 is made of silicon oxynitride (SiON). The trapping layer 525 is made of silicon nitride (SiN). The gate layer 529 is made of polysilicon. The thickness of the first tunneling layer 521 is in the range between 20 and 30 angstroms (Å). The thickness of the second tunneling layer 523 is in the range between 10 and 20 angstroms. The thickness of the trapping layer 525 is about 45 angstroms. The thickness of the blocking layer 527 is in the range between 45 and 50 angstroms.

Preferably, the total thickness of the first tunneling layer 521 and the second tunneling layer 523 is larger than 30 angstroms. Moreover, the thickness of the blocking layer 527 is larger than the thickness of the trapping layer 525, the thickness of the trapping layer 525 is larger than the thickness of the first tunneling layer 521, and the thickness of the first tunneling layer 521 is larger than the thickness of the second tunneling layer 523.

A process of forming the gate structure of the storage transistor in the memory cell of the second embodiment will be described as follows.

Firstly, the first tunneling layer 521 (i.e., a silicon dioxide layer) is formed on the surface of the well region. Then, a decoupled plasma nitridation (DPN) process is performed on the first tunneling layer 521. Consequently, the second tunneling layer 523 (i.e., a silicon oxynitride layer) is formed over the first tunneling layer 521 to cover the first tunneling layer 521. Then, the trapping layer 525 (i.e., a silicon nitride layer), the blocking layer 527 (i.e., another silicon dioxide layer) and the gate layer 529 (i.e., a polysilicon layer) are sequentially formed.

During the DPN process, the dopant concentration of the oxygen atom in silicon oxynitride (SiON) is changed. Consequently, the nitrogen concentration (N-concentration) is gradually increased during the formation of the silicon oxynitride (SiON) layer. That is, the second tunneling layer 523 has gradient nitrogen distribution. For example, the second tunneling layer 523 has zero N-concentration or lower N-concentration at its bottom interface contacting with the first tunneling layer 521. Since the N-concentration of the second tunneling layer 523 gradually increases, the second tunneling layer 523 has higher N-concentration at its top interface contacting with the trapping layer 525.

That is to say, the second tunneling layer 523 at least includes a first region 523a and a second region 523b. The first region 523a of the second tunneling layer 523 is close to the first tunneling layer 521, and the second region 523b of the second tunneling layer 523 is close to the trapping layer 525. A first N-concentration of the first region 523a of the second tunneling layer 523 is lower than a second N-concentration of the second region 523b of the second tunneling layer 523.

In an embodiment, the trapping layer 525 (i.e., the silicon nitride layer) has a dielectric constant (K) of about 8, the second tunneling layer 523 (i.e., the silicon oxynitride layer) has a dielectric constant in the range between 7.5 and 8, and the first tunneling layer 521 (i.e., the silicon dioxide layer) has a dielectric constant of about 3.9. Generally, the material with the dielectric constant lower than 4.0 may be considered as a low-K material, and the material with the dielectric constant higher than 6.9 may be considered as a high-K material. In other words, the dielectric constant (K) of the first tunneling layer 521 (i.e., the silicon dioxide layer) is the lowest, and the electric field in the first tunneling layer 521 is the highest during the erase action. As shown in FIG. 5B, the energy band of the first tunneling layer 521 is largely inclined during the erase action. Since the electrons can be transmitted through the two tunneling layers 521 and 523 more easily, the erase action can be completed.

Moreover, the material of the blocking layer 527 is specially selected to increase the FN tunneling efficiency of erase action. In an embodiment, the blocking layer 527 is made of high-K material, and the dielectric constant (K) of the blocking layer 527 is larger than two times the dielectric constant (K) of the first tunneling layer 521. Since the blocking layer 527 is made of high-K material, the electric field in the first tunneling layer 521 becomes larger during the erase action, and the FN tunneling efficiency is increased. In an embodiment, the first tunneling layer 521 (i.e., the silicon dioxide layer) has a dielectric constant of about 3.9, and the blocking layer 527 is made of a material with a dielectric constant larger than 7.8. For example, the blocking layer 527 is made of a material with a higher dielectric constant (e.g., Al2O3, HfSiON, HfO2, HfSiO4, ZrO2 or a combination thereof).

In addition to silicon nitride (SiN), the trapping layer 525 may be made of any other appropriate high-K material. For example, in some other embodiments, the trapping layer 525 is made of hafnium dioxide ($HfO_2$), zirconium dioxide ($ZrO_2$), titanium dioxide ($TiO_2$), hafnium silicate ($HfSiO_4$), lanthanum oxide ($La_2O_3$), lanthanum aluminum oxide ($LaAlO_3$) or yttrium oxide ($Y_2O_3$).

FIG. 6A is a schematic cross-sectional view illustrating a gate structure of a storage transistor in a memory cell of a charge-trapping non-volatile memory according to a third embodiment of the present invention. FIG. 6B is an energy band diagram of the gate structure of the storage transistor in the memory cell as shown in FIG. 6A.

As shown in FIG. 6A, the gate structure 528 of the storage transistor Ms comprises a first tunneling layer 521, a second tunneling layer 524, a trapping layer 525, a blocking layer 527 and a gate layer 529. In comparison with the gate structure 520 in the second embodiment, the second tunneling layer 524 of the gate structure 528 of the memory cell in the third embodiment has a different nitrogen distribution.

Similarly, the dopant concentration of the oxygen atom in the second tunneling layer 524 is changed. According to the third embodiment, the second tunneling layer 524 will be nitrided first and then oxidized. In this way, the nitrogen concentration (N-concentration) is gradually increased and then gradually decreased during the formation of the second tunneling layer 524.

For example, the second tunneling layer 524 includes a first silicon dioxide ($SiO_2$) region, a first silicon oxynitride (SiON) region, a silicon nitride (SiN) region, a second silicon oxynitride (SiON) region and a second silicon dioxide ($SiO_2$) region. During the formation of the second tunneling layer 524, the N-concentration of the second tunneling layer 524 gradually increases, the first silicon dioxide ($SiO_2$) region with zero N-concentration and the first silicon oxynitride (SiON) region with increased N-concentration may be sequentially formed above the first tunneling layer 521. Since the N-concentration of the second tunneling layer 524 gradually increases, a silicon nitride (SiN) region covering the first silicon oxynitride (SiON) region may be formed in the central region of the second tunneling layer 524. Then, the N-concentration of the second tunneling layer 524 gradually decreases, and the second silicon oxynitride (SiON) region with decreased N-concentration and the second silicon dioxide ($SiO_2$) with zero N-concentration region are sequentially formed above the silicon nitride (SiN) region.

That is to say, the second tunneling layer 524 includes a plurality of regions. A first region 524a of the second tunneling layer 524 covers the first tunneling layer 521, a second region 524b of the second tunneling layer 524 covers the first region 524a of the second tunneling layer 524, a third region 524c of the second tunneling layer 524 covers the second region 524b of the second tunneling layer 524, a fourth region 524d of the second tunneling layer 524 covers the third region 524c of the second tunneling layer 524, and a fifth region 524e of the second tunneling layer 524 covers the fourth region 524d of the second tunneling layer 524. The trapping layer 525 covers the fifth region 524e of the second tunneling layer 524.

A first N-concentration of the first region 524a of the second tunneling layer 524 is lower than a second N-concentration of the second region 524b of the second tunneling layer 524, the second N-concentration of the second region 524b of the second tunneling layer 524 is lower than a third N-concentration of the third region 524c of the second tunneling layer 524, a fourth N-concentration of the fourth region 524d of the second tunneling layer 524 is lower than the third N-concentration of the third region 524c of the second tunneling layer 524, and a fifth N-concentration of the fifth region 524e of the second tunneling layer 524 is lower than the fourth N-concentration of the fourth region 524d of the second tunneling layer 524. In some embodiments, the third region 524c and the fourth region 524d of the second tunneling layer 524 can be omitted, and the fifth region 524e of the second tunneling layer 524 is located between the trapping layer 525 and the second region 524b of the second tunneling layer 524.

Due to the nitrogen distribution in the second tunneling layer 524, the energy band diagram of the gate structure shown in FIG. 6B includes a higher barrier build at the interface of trapping layer 525 and the second tunneling layer 524 to improve the data retention performance of the storage transistor in the memory cell.

FIG. 7A is a schematic cross-sectional view illustrating a gate structure of a storage transistor in a memory cell of a charge-trapping non-volatile memory according to a fourth embodiment of the present invention. FIG. 7B is an energy band diagram of the gate structure of the storage transistor in the memory cell as shown in FIG. 7A. In comparison with the gate structure of the memory cell in the second embodiment, the trapping layer 535 of the gate structure 530 of the memory cell in the fourth embodiment is made of a silicon-rich nitride material. Similarly, the gate structure 530 comprises a first tunneling layer 531, a second tunneling layer 533, the trapping layer 535, a blocking layer 537 and a gate layer 539. The trapping layer 535 is made of a silicon-rich nitride material. For example, the silicon-rich nitride material is silicon-rich silicon nitride.

In the silicon-rich silicon nitride, the higher silicon content is correlated with the high refractive index. That is, the silicon-rich nitride material may be selected according to the refractive index. For example, the silicon nitride with the refractive index larger than 2.1 is considered as the silicon-rich nitride material.

When compared with the trapping layer 525 in the second embodiment, the trapping layer 535 in the fourth embodiment has more shallow traps and less deep traps. The energy level of the shallow trap is lower than 1 eV. The energy gap of the deep trap is higher than 1 eV. After the program action, a greater number of electrons are trapped in the shallow traps, and a smaller number of electrons are trapped in the deep traps. Since the energy level of the shallow trap is lower, the electrons can be escaped from the shallow trap more easily during the erase action. After the electrons are transmitted through the tunneling layers 531 and 533, the erase action is completed.

In the second embodiment, the electron barrier between the trapping layer 525 and the second tunneling layer 523 is about 1.1 eV. In the fourth embodiment, the electron barrier between the trapping layer 535 and the second tunneling layer 533 is about 1.4 eV. That is, the electron barrier between the trapping layer 535 and the second tunneling layer 533 is higher. The higher electron barrier can mitigate the thermal emission and increase the data retention capability.

It is noted that the technical features of the above four embodiments can be combined with each other. That is, in some other embodiments, the memory cell may have the combined technical features of the above four embodiments. For example, in case that the technical features of the first embodiment and the second embodiment are combined, the work function of the gate layer in the gate structure of the memory cell is higher than the work function of the well region, and the second tunneling layer has the gradient nitrogen distribution. Similarly, in another embodiment, the memory cell has the technical features of the first embodiment and the fourth embodiment.

From the above descriptions, the present invention provides a memory cell of a charge-trapping non-volatile memory. The memory cell comprises a switch transistor and a storage transistor. The gate structure of the storage transistor is specially designed. Consequently, the erase efficiency of the memory cell during the erase action is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A memory cell of a charge-trapping non-volatile memory, the memory cell being formed on a well region of a semiconductor substrate, the memory cell comprising a storage transistor, a gate structure of the storage transistor comprising:
    a first tunneling layer contacted with a surface of the well region;
    a second tunneling layer covering the first tunneling layer;
    a trapping layer covering the second tunneling layer;
    a blocking layer covering the trapping layer; and
    a gate layer covering the blocking layer;
    wherein the second tunneling layer includes a first region and a second region, a first nitrogen concentration of the first region of the second tunneling layer close to the first tunneling layer is lower than a second nitrogen concentration of the second region of the second tunneling layer close to the trapping layer;
    wherein the second tunneling layer further includes a third region located between the trapping layer and the second region of the second tunneling layer, wherein the second nitrogen concentration of the second region of the second tunneling layer is higher than a third nitrogen concentration of the third region of the second tunneling layer.

2. The memory cell as claimed in claim 1, wherein a work function of the gate layer is higher than a work function of the well region.

3. The memory cell as claimed in claim 2, wherein the gate layer is a polysilicon gate layer or a metal gate layer.

4. The memory cell as claimed in claim 1, wherein the first tunneling layer has a first dielectric constant, and the blocking layer has a second dielectric constant, wherein the second dielectric constant is larger than two times the first dielectric constant.

5. The memory cell as claimed in claim 4, wherein the blocking layer is made of $Al_2O_3$, HfSiON, $HfO_2$, $HfSiO_4$, $ZrO_2$ or a combination thereof.

6. The memory cell as claimed in claim 1, wherein a refractive index of the trapping layer is larger than 2.1.

7. The memory cell as claimed in claim 1, wherein the trapping layer is made of a silicon-rich nitride material.

8. The memory cell as claimed in claim 7, wherein the silicon-rich nitride material is silicon-rich silicon nitride.

9. The memory cell as claimed in claim 1, wherein the trapping layer is made of hafnium dioxide, zirconium dioxide, titanium dioxide, hafnium silicate, lanthanum oxide, lanthanum aluminum oxide or yttrium oxide.

10. The memory cell as claimed in claim 1, wherein a total thickness of the first tunneling layer and the second tunneling layer is larger than 30 angstroms.

11. The memory cell as claimed in claim 1, wherein the blocking layer is thicker than the trapping layer, the trapping layer is thicker than the first tunneling layer, and the first tunneling layer is thicker than the second tunneling layer.

12. The memory cell as claimed in claim 1, wherein the first tunneling layer and the blocking layer are made of silicon dioxide.

13. The memory cell as claimed in claim 1, wherein the second tunneling layer is made of silicon oxynitride.

14. The memory cell as claimed in claim 1, wherein the storage transistor comprises:
    a first doped region and a second doped region formed in the surface of the well region;
    the gate structure formed over the surface of the well region between the first doped region and the second doped region; and
    a spacer formed on a sidewall of the gate structure and arranged around the gate structure.

15. The memory cell as claimed in claim 1, wherein the first region and the third region of the second tunneling layer are made of silicon dioxide.

16. The memory cell as claimed in claim 1, wherein the second tunneling layer further includes a fourth region and a fifth region, the first region covers the first tunneling layer, the second region covers the first region, the fourth region covers the second region, the fifth region covers the fourth region, the third region covers the fifth region, and the trapping layer covers the third region of the second tunneling layer, wherein a fourth nitrogen concentration of the fourth region of the second tunneling layer is higher than a fifth nitrogen concentration of the fifth region of the second tunneling layer, and the fifth nitrogen concentration of the fifth region of the second tunneling layer is higher than the third nitrogen concentration of the third region of the second tunneling layer.

17. The memory cell as claimed in claim 16, wherein the second region and the fifth region of the second tunneling layer are made of silicon oxynitride.

18. The memory cell as claimed in claim 16, wherein the fourth region of the second tunneling layer is made of silicon nitride.

* * * * *